(12) United States Patent
Wang

(10) Patent No.: US 7,173,462 B1
(45) Date of Patent: Feb. 6, 2007

(54) SECOND ORDER DELAY-LOCKED LOOP FOR DATA RECOVERY

(75) Inventor: Ping-Ying Wang, Hsin-Chu (TW)

(73) Assignee: Mediatek Inc., Hsin-Chu Hsien (TW)

( * ) Notice: Subject to any disclaimer, the term of this patent is extended or adjusted under 35 U.S.C. 154(b) by 0 days.

(21) Appl. No.: 11/163,679

(22) Filed: Oct. 27, 2005

(51) Int. Cl.
*H03L 7/06* (2006.01)

(52) U.S. Cl. ...................... 327/158; 327/149

(58) Field of Classification Search .............. None
See application file for complete search history.

(56) References Cited

U.S. PATENT DOCUMENTS

| | | | | |
|---|---|---|---|---|
| 5,450,028 A | * | 9/1995 | Therssen | 327/91 |
| 6,208,211 B1 | * | 3/2001 | Zipper et al. | 331/17 |
| 6,775,345 B1 | * | 8/2004 | Song | 375/376 |
| 6,803,834 B1 | * | 10/2004 | Chen | 331/179 |
| 6,888,331 B2 | * | 5/2005 | Morales Serrano | 318/439 |
| 6,933,791 B2 | * | 8/2005 | Chen | 331/45 |
| 6,943,598 B2 | * | 9/2005 | Ghazali et al. | 327/147 |
| 7,061,276 B2 | * | 6/2006 | Xu | 327/2 |
| 2005/0206417 A1 | * | 9/2005 | Morche | 327/158 |

* cited by examiner

*Primary Examiner*—Timothy P. Callahan
*Assistant Examiner*—Cassandra Cox
(74) *Attorney, Agent, or Firm*—Winston Hsu

(57) ABSTRACT

A DLL system includes a phase detector coupled to an input signal for generating a first phase error signal according to the input signal and a clock signal; an up-down counter coupled to the phase detector for generating a counting signal according to the first phase error signal; a sigma-delta modulator (SDM) coupled to the up-down counter for generating a second phase error signal according to the counting signal; an adder coupled to the SDM and the phase detector for summing the first phase error signal and the second phase error signal to generate a sum signal; a clock generator for generating a plurality of candidate clock signals according to a reference clock; and a multiplexer coupled to the clock generator and the phase detector for selecting one of the candidate clock signals to be the clock signal inputted into the phase detector according to the sum signal.

33 Claims, 1 Drawing Sheet

SECOND ORDER DELAY-LOCKED LOOP FOR DATA RECOVERY

BACKGROUND

The invention relates to a delay-locked loop (DLL), and more particularly, to a second order DLL utilized for clock and data recovery.

When recovering data transmitted via an input data signal, a phase locking circuit is required to track the input data signal. If the input data signal is under a fixed clock with only minor frequency variation caused by noise, either a phase-locked loop (PLL) or a delay-locked loop (DLL) can be utilized as the above-mentioned phase locking circuit since both the PLL and the DLL are capable of tracking such a phase variation of the input data signal. On the other hand, if the input data signal is a spread-spectrum signal, such as a Serial ATA (SATA) signal, a PLL is utilized since a conventional DLL is unable to track a spread-spectrum signal.

However, a PLL suffers from several shortcomings despite its ability to track a variety of signals. Firstly, a PLL occupies a large chip area in an integrated circuit (IC), resulting in a high cost compared to a DLL. Secondly, a PLL includes a voltage controlled oscillator (VCO) for generating a clock signal locked to an input signal of the PLL. The VCO inherently accumulates jitters, causing the noise immunity of the PLL to be poorer than that of a DLL.

SUMMARY

It is therefore one of the objectives of the claimed invention to provide a second order delay-locked loop (DLL) circuit having the ability to track a spread-spectrum signal, to solve the above-mentioned problem.

The claimed invention provides a high-order DLL system. The DLL system comprises a phase detector coupled to an input signal for generating a first phase error signal according to the input signal and a clock signal; an up-down counter coupled to the phase detector for generating a counting signal according to the first phase error signal; a sigma-delta modulator (SDM) coupled to the up-down counter for generating a second phase error signal according to the counting signal; an adder coupled to the SDM and the phase detector for summing the first phase error signal and the second phase error signal to generate a sum signal; a clock generator for generating a plurality of candidate clock signals according to a reference clock; and a multiplexer coupled to the clock generator and the phase detector for selecting one of the candidate clock signals to be the clock signal inputted into the phase detector according to the sum signal.

The claimed invention further provides a method for generating a clock signal to track an input signal. The method includes generating a first phase error signal according to the input signal and the clock signal; counting up or down according to the first phase error signal to generate a counting signal; generating a second phase error signal by performing a sigma-delta modulation on the counting signal; summing the first phase error signal and the second phase error signal to generate a sum signal; generating a plurality of candidate clock signals according to a reference clock; and selecting one of the candidate clock signals to be the clock signal locked to the input signal according to the sum signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
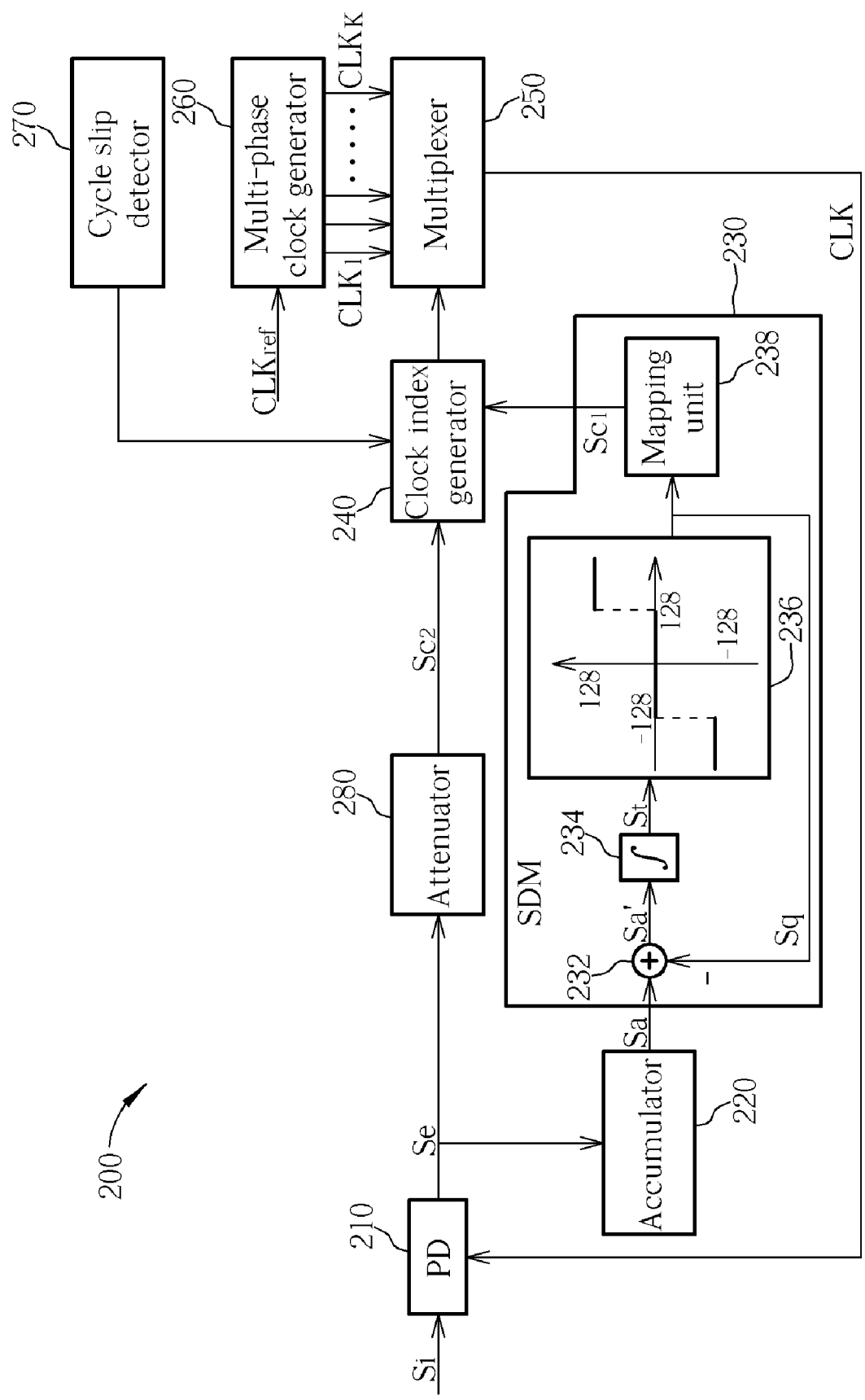
FIG. 1 is a block diagram of a second order delay-locked loop circuit according to an embodiment of the present invention.

The present invention is related to a DLL system, which refers to a reference clock $CLK_{ref}$ to track an input signal $S_i$. The reference clock is of frequency $f_1$. The input signal $S_i$, might be a target clock signal or a data signal of frequency $f_2$. The target clock frequency $f_2$ might be more than or less than the reference clock frequency $f_1$, and the phase of the reference clock might lead or lag the target clock. In order to track the input signal $S_i$ with the reference clock $CLK_{ref}$, the present invention uses a delay-locked loop (DLL) technique implemented as two correcting paths. The two correcting paths compensate variations between the reference clock and target clock, the variations including frequency variation and phase variation. The reference clock is corrected by the two correcting paths to recover a clock that has substantially the same frequency and phase with the target clock. Then the recovered clock is applied to track the input signal $S_i$.

Please refer to FIG. 1. FIG. 1 is a block diagram illustrating a second order delay-locked loop (DLL) system 200 according to an embodiment of the present invention. As shown in FIG. 1, the second order DLL system 200 contains a phase detector (PD) 210, a low pass filter that is implemented by an accumulator 220 in this embodiment, a sigma-delta modulator (SDM) 230, an clock index generator 240, a multi-phase clock generator 260, a cycle slip detector 270, and an attenuator 280. The PD 210 detects a phase difference between an input signal $S_i$ and a recovered clock CLK and generates a phase error signal $S_e$. The phase error signal $S_e$ represents the direction and amount of the phase difference between the input signal $S_i$ and the recovered clock CLK, the direction of the phase difference is either phase leading or phase lagging. The path from the phase error signal $S_e$, which is then accumulated by the accumulator 220 and further integrated and quantized by the SDM 230 to be a frequency correcting signal $S_{c1}$, forms the frequency correcting path. The path from the phase error signal $S_e$, which is then attenuated by the attenuator 290 to be a phase correcting signal $S_{c2}$, forms a phase correcting path. The frequency correcting signal $S_{c1}$ and the phase correcting signal $S_{c2}$ are further fed into a clock index generator 240 for correcting the clock index to control the phase shift of the recovered clock CLK.

The multi-phase clock generator 260 is used to generate K candidate clocks $CLK_1 \sim CLK_K$ providing to the multiplexer 250 with referred to a reference clock $CLK_{ref}$. The candidate clocks $CLK_1 \sim CLK_K$ are delayed versions of the reference clock $CLK_{ref}$ and therefore, each has identical frequency but different phases with the reference clock and with each other candidate clock.

The clock index generator 240 generates a clock index and corrects the clock index according to the frequency correcting signal $S_{c1}$ and the phase correcting signal $S_{c2}$. Once the sum of the two correcting signals $S_{c1}$ and $S_{c2}$ is $\Delta i$, the clock index will be corrected from i to i+$\Delta i$ accordingly.

According to the clock index, the multiplexer 250 selects one of the K candidate clocks $CLK_1$~$CLK_K$ to be as the recovered clock CLK, the selection is determined by the clock index. When the clock index is of value i, the $i^{th}$ of the K candidate clocks $CLK_i$ is selected as the recovered clock CLK. Once the clock index from i changed to i', the multiplexer 250 accordingly changes the clock selection from $CLK_i$ to $CLK_{i'}$, the selection change causes a phase shift of the recovered clock. The number of K determines the resolution of the phase shift. If the clock period of the reference clock is T, with K equals to 32, in one embodiment of the present invention, the 32 delayed candidate clocks are designed to be with evenly spaced phase difference within one clock period. That is, every step of selection change corresponds to T/32 phase shift. The clock index changing from i to i+1 causes T/32 phase delaying, and clock index change from i to i−1 causes T/32 phase advancing.

The delayed range among the K candidate clocks $CLK_1$~$CLK_K$, from the least delayed candidate clock to the most delayed candidate clock at least covers one cycle period of the reference clock $CLK_{ref}$. A cycle slip detector 270 is provided to discover the cycle slip between the reference clock $CLK_{ref}$ and the recovered clock CLK. Once the cycle slip is detected, the cycle slip detector 270 informs the clock index generator 240 to remove the cycle slip.

In this embodiment, the accumulator 220 is an 8-bit counter capable of counting up or counting down. The output of the accumulator 220 is either positive or negative, with a dynamic range from −127 to +127, to accumulate the phase error signal $S_e$ to be as an accumulated factor $S_a$.

The SDM 230 further integrates and quantizes the accumulated factor $S_a$. The $S_a$ is first fed into a subtractor 232, in which being subtracted by a quantized signal $S_q$ and becomes a difference signal $S_{a'}$. The difference signal $S_{a'}$ is further integrated by an integrator 234 to be an integrated signal $S_t$. A quantizer 236 quantizes the integrated signal $S_t$ to be as the quantized signal $S_q$ according to three quantization levels, −128, 0 and 128. The quantized signal $S_q$ is then fed back to the subtractor 232. A mapping unit 238 maps the three levels −128, 0, 128 quantized signal $S_q$ into three controlling levels of values −1, 0, 1, respectively. The SDM 230 in the present embodiment is a first order SDM. However, the clock recovery system 200 is not limited to utilizing the first order SDM. For example, the second order SDM or higher-order SDM could also be used in this clock/data recovery system.

The phase difference between two signals could be expressed as a function of time t, as $phase_{diff} = f_v t + p_v$. The zero order term $p_v$, which is substantially time-invariant, represents the phase difference caused by the phase variation between two signals. The first order term $f_v t$, which is substantially linear time-varying, represents the phase difference caused by the frequency variation $f_v$ between two signals. In order to track the input signal referred to the reference clock, the present invention extracts and compensates the two variations between input signal and reference clock. The extraction and compensation is implemented as two correcting paths corresponding to two correcting signals.

The attenuator 280 inserted in the phase correcting path, attenuates the phase gain along the phase correcting path. The phase gain is defined as the ratio between the corrected phase shift and the detected phase difference, wherein the corrected phase shift is the phase shift of the recovered clock CLK in response to the updating of the clock index based on the phase correcting signal $S_{c2}$ and the detected phase difference is the phase difference between the input signal $S_i$ and the recovered clock CLK being detected by the phase detector 210. For example, the detected phase difference between the input signal and the recovered clock difference is T/8, and the corrected phase shift of the recovered clock is T/32, the corresponding phase gain is ¼. A less than 1 phase gain makes the phase shift of the recovered clock not so sensitively react as the detected phase difference. Thus the instantaneous phase jitter or phase noise will be filtered out or attenuated and will not be directly reflected on the recovered clock, the stability of the recovered clock is therefore improved.

In the frequency correcting path of the present embodiment, the detection of phase difference will be accumulated in the accumulator 220 as an accumulated factor $S_a$, which acts as a frequency controlling factor. The frequency controlling factor controls the direction and amount of the phase correcting to compensate the frequency variation between the reference clock $CLK_{ref}$ and the target clock. Direction of the phase correcting is either phase delaying or phase advancing. If the target clock frequency is larger than the reference clock frequency, the frequency controlling factor is negative. This negative frequency controlling factor integrated and quantized by the SDM 230 produces one time negative $S_{c1}$ within few recovered clock cycles, the negative $S_{c1}$ results in phase advancing of the recovered clock CLK. The regularly happened phase advancing causes the recovered clock frequency more than the reference clock frequency. If the target clock frequency is less than the reference clock frequency, the frequency controlling factor is positive. This positive frequency controlling factor integrated and quantized by the SDM 230 produces one time positive $S_{c1}$ within few recovered clock cycles, the positive $S_{c1}$ results in phase delaying of the recovered clock CLK. The regularly happened phase delaying causes the recovered clock frequency less than the reference clock frequency. If the target clock frequency still less than the recovered clock frequency, the phase detector detects the phase leading of the recovered clock than the input signal to increase the frequency controlling factor. The increased frequency controlling factor produces more times positive $S_{c1}$ within the same few recovered clock cycles which makes more frequently phase delaying. Then the recovered clock frequency will become further less. For example, if the accumulated factor $S_a$ is 32, every four reference clock cycles the accumulated factor $S_a$ is integrated to be 128, which produces the frequency correcting signal $S_{c1}$ as 1 to cause one phase delaying. If the reference clock period is T, with the phase shifting step of T/32, the time period for every 4 recovered clock cycles is 4T+T/32, the recovered clock frequency is corrected as slightly less than the reference clock frequency.

The present embodiment uses the DLL technique to implement the clock recovery system. This makes the clock recovery system tracking the frequency variation and phase variation between the reference clock and the target clock in all digital way, whereas the DLL technique saves the large area caused by the PLL technique. Also the same one candidate clocks generator could be shared by several input signals tracking.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A DLL system for generating a recovered clock CLK based on an input signal and a reference clock $CLK_{ref}$, the DLL system comprising:
   a phase detector for receiving the input signal and the recovered clock and generating a phase error signal indicating a phase difference between the input signal and the recovered clock CLK;
   a first correcting signal generator comprising a sigma-delta modulator, coupled to the phase detector, for generating a first correcting signal based on the phase error signal;
   a clock index generator, coupled to the first correcting signal generator, for generating a clock index by updating the clock index based on the first correcting signal;
   a multiphase clock generator, coupled to the reference clock, for delaying the reference clock to generate a plurality of delayed versions of the reference clock as a plurality of candidate clocks; and
   a multiplexer, coupled to the multiphase clock generator and the clock index generator, for selecting one of the plurality of candidate clocks according to the clock index to form the recovered clock.

2. The DLL system of claim 1, wherein the sigma-delta modulator (SDM) of the first correcting signal generator integrates and quantizes a frequency controlling signal according to a plurality of preset quantization levels to generate a quantized signal, and the first correcting signal generator further comprises:
   a low pass filter for receiving the phase error signal to generate the frequency controlling signal; and
   a mapping unit for mapping the quantized signal into one of a plurality of controlling levels to generate the first correcting signal.

3. The DLL system of claim 1, the DLL system further comprises a cycle slip detector, coupled to the clock index generator, for detecting cycle slip between the recovered clock and the reference clock and controlling the clock index generator to remove the detected cycle slip.

4. The DLL system of claim 2, wherein the cycle slip detector comprises:
   a comparator for comparing the clock index with a cycle range number, which representing the cycle slip between the recovered clock and the reference clock and if the clock index is equal to or larger than the cycle range number then sending out a cycle slip detecting signal;
   wherein the clock index generator receives the cycle slip detecting signal then subtract the clock index by the cycle range number.

5. The DLL system of claim 2, wherein the low pass filter is an accumulator.

6. The DLL system of claim 1, wherein the DLL system further comprises:
   a second correcting signal generator, coupled to the phase detector, for generating a second correcting signal based on the phase error signal;
   wherein the clock index generator, coupled to the first correcting signal generator and the second correcting signal generator, updates the clock index based on the first correcting signal and the second correcting signal to generate the clock index.

7. The DLL system of claim 6, wherein the second correcting signal generator generates the second correcting signal by dividing the phase error signal by a preset number which is larger than unity.

8. The DLL system of claim 6, wherein a phase gain, which is defined as the ratio between a phase shift of the recovered clock in response to the updating of the clock index based on the second correcting signal and the phase difference between the input signal and the recovered clock, is less than or equal to unity.

9. The DLL system of claim 6, wherein the system further comprises a divider coupled between the clock index generator and the multiplexer for dividing the clock index to form a divided clock index and outputting the divided clock index to the multiplexer, and the multiplexer selects one of the plurality of candidate clocks according to the divided clock index to form the recovered clock.

10. The DLL system of claim 1, wherein the clock index generator is further connected to the phase detector and the clock index generator updates the clock index based on the first correcting signal and the phase error signal to generate the clock index.

11. The DLL system of claim 1, wherein the SDM is a first order SDM.

12. The DLL system of claim 11, wherein the first order SDM comprising:
   a subtractor for subtracting a quantized signal from the frequency controlling signal to generate a difference signal;
   an integrator for integrating the difference signal to generate an integrated signal; and
   a quantizor for quantizing the integrated signal to be one of the plurality of quantization levels to form the quantized signal.

13. The DLL system of claim 12, wherein the plurality of quantization levels are +N, −N, with N being a preset positive number.

14. The DLL system of claim 12, wherein the plurality of quantization levels are K*N, with N being a preset positive number and K belonging to nonzero numbers.

15. The DLL system of claim 14, wherein the mapping unit is a divider for generating the first correcting signal by dividing the quantized signal by the preset number N.

16. The DLL system of claim 1, wherein the SDM is a $K^{th}$ order SDM, and wherein K is larger than 1.

17. The DLL system of claim 1, wherein the input signal is a serial ATA signal.

18. The DLL system of claim 1, wherein the adjacent delayed versions of the reference clock are with equal phase difference.

19. A method for generating a clock CLK based on an input signal $S_i$ and a reference clock $CLK_{ref}$, the method comprising:
   generating a phase error signal indicating a phase difference between the input signal and the recovered clock CLK;
   generating a first correcting signal using a sigma-delta modulation scheme based on the phase error signal;
   generating a clock index by updating the clock index based on the first correcting signal; and
   delaying the reference clock to generate a plurality of delayed versions of reference clock as a plurality of candidate clocks; and
   selecting one of the plurality of candidate clocks according to the clock index to form the recovered clock.

20. The method of claim 19, the step of generating a first correcting signal comprises:
   low pass filtering the phase error signal to generate a frequency controlling signal;
   sigma-delta modulating the frequency controlling signal including integrating and quantizing the frequency controlling signal according to a plurality of preset quantization levels to generate a quantized signal; and mapping the quantized signal into one of a plurality of controlling levels to generate the first correcting signal.

21. The method of claim 19, the method further comprises:

detecting cycle slip between the recovered clock and the reference clock and controlling the clock index generator to remove the detected cycle slip.

22. The method of claim 20, wherein the low pass filtering the phase error signal is to accumulate the phase error signal.

23. The method of claim 19, the method further comprises:

generating a second correcting signal based on the phase error signal;

wherein the updating clock index is based on the first correcting signal and the second correcting signal.

24. The method of claim 23, wherein the generating the second correcting signal is to divide the phase error signal by a preset number which is larger than unity.

25. The method of claim 23, wherein the second correcting signal equals to the phase error signal and the updating clock index is based on the first correcting signal and the phase error signal.

26. The method of claim 23, wherein a phase gain, which is defined as the ratio between a phase shift of the recovered clock in response to the updating of the clock index based on the second correcting signal and the phase difference between the input signal and the recovered clock is less than or equal to unity.

27. The method of claim 20, wherein the step of sigma-delta modulating the frequency controlling signal is performed by means of a first order sigma-delta modulator.

28. The method of claim 27, wherein the step of sigma-delta modulating the frequency controlling signal, comprising:

subtracting a quantized signal from the frequency controlling signal to generate a difference signal;

integrating the difference signal to generate an integrated signal; and quantizing the integrated signal to be one of the plurality of quantization levels to form the quantized signal.

29. The method of claim 28, wherein the plurality of quantization levels are +N, −N, with N being a preset positive number.

30. The method of claim 28, wherein the plurality of quantization levels are K*N, with N being a preset positive number and K belonging to nonzero numbers.

31. The method of claim 28, wherein the step of mapping the quantized signal is to divide the quantized signal by the preset number N.

32. The method of claim 19, wherein the input signal is a serial ATA signal.

33. The method of claim 19, wherein the adjacent delayed versions of the reference clock are with equal phase difference.

* * * * *